(12) United States Patent
Cho et al.

(10) Patent No.: US 9,385,194 B2
(45) Date of Patent: Jul. 5, 2016

(54) NANOPARTICLES AND METHODS OF MANUFACTURING THE SAME

(75) Inventors: Kyung-sang Cho, Gwacheon-si (KR); Byoung-lyong Choi, Seoul (KR); Tae-ho Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 1019 days.

(21) Appl. No.: 13/478,961

(22) Filed: May 23, 2012

(65) Prior Publication Data

US 2013/0092885 A1  Apr. 18, 2013

(30) Foreign Application Priority Data

Oct. 18, 2011  (KR) .......................... 10-2011-0106637

(51) Int. Cl.

| | | |
|---|---|---|
| *B82Y 10/00* | (2011.01) | |
| *H01L 29/06* | (2006.01) | |
| *H01L 29/12* | (2006.01) | |
| *H01L 29/20* | (2006.01) | |
| *H01L 29/22* | (2006.01) | |
| *B82Y 30/00* | (2011.01) | |
| *B82Y 40/00* | (2011.01) | |
| *C01B 19/00* | (2006.01) | |
| *H01B 1/00* | (2006.01) | |
| *H01L 29/76* | (2006.01) | |

(52) U.S. Cl.
CPC .............. *H01L 29/0665* (2013.01); *B82Y 10/00* (2013.01); *B82Y 30/00* (2013.01); *B82Y 40/00* (2013.01); *C01B 19/002* (2013.01); *C01B 19/007* (2013.01); *H01L 29/127* (2013.01); *H01L 29/20* (2013.01); *H01L 29/22* (2013.01);

*C01P 2002/82* (2013.01); *C01P 2006/40* (2013.01); *H01L 29/7613* (2013.01)

(58) Field of Classification Search
CPC .............. H01B 1/10; H01B 1/00; H01B 1/12; B82Y 40/00; B82Y 50/00
USPC ............. 252/519.3, 500, 519.4; 977/896, 773
See application file for complete search history.

(56) References Cited

U.S. PATENT DOCUMENTS

| | | | |
|---|---|---|---|
| 7,405,129 B2 | | 7/2008 | Afzali-Ardakani et al. |
| 2005/0054004 A1* | | 3/2005 | Alivisatos et al. ............. 435/7.1 |

(Continued)

FOREIGN PATENT DOCUMENTS

| | | |
|---|---|---|
| JP | 200551224 A | 2/2005 |
| JP | 2007185764 A | 7/2007 |
| WO | 2007/049052 A2 | 5/2007 |

OTHER PUBLICATIONS

Kovalenko et al. "Colloidal Nanocrystals with Molecular Metal Chalcogenide Surface Ligands". Published May 14, 2009. ScienceMag, vol. 324. Total pp. 4.*

(Continued)

*Primary Examiner* — Mark Kopec
*Assistant Examiner* — Danny N Kang
(74) *Attorney, Agent, or Firm* — Sughrue Mion, PLLC (57) ABSTRACT

A method of manufacturing nanoparticles including: providing a metal chalcogenide complexes (MCC) hydrazine hydrate solution; providing a first organic solution of nanoparticles with first organic ligands; forming a mixed solution by mixing the MCC hydrazine hydrate solution and the first organic solution of nanoparticles capped with the first organic ligands; and replacing the first organic ligands of the nanoparticles with ligands of the MCC hydrazine hydrate.

6 Claims, 9 Drawing Sheets

(56) References Cited

U.S. PATENT DOCUMENTS

2010/0019238 A1 1/2010 Mitzi et al.
2010/0291724 A1 11/2010 Landry et al.

OTHER PUBLICATIONS

Ramalingam et al. "Structural and optical property studies of CdSe crystalline nanorods synthesized by a solvothermal method". Available Mar. 21, 2009. Journal of Crystal Growth 311 (2009) 3138-3142. Total pp. 5.*

Dong et al. "Semiconductor zinc chalcogenides nanofibers from 1-D molecular precursors". Avialbe Jan. 10, 2004. Inorganic Chemistry Communications 7 (2004) 370-373. Total pp. 4.*

Bhat, Denthaje. "Facile Synthesis of ZnO Nanorods by Microwave Irradiation of Zinc-Hydrazine Hydrate Complex". Nano Express. (2008) 3:31-35. Dec. 11, 2007. Total pp. 5.*

Kovalenko, et al., "Colloidal Nanocrystals with Molecular Metal Chalcogenide Surface Ligands", Science, vol. 324, No. 5933, Jun. 12, 2009, pp. 1417-1420.

Dong, et al., "Semiconductor zinc chalcogenides nanofibers from 1-D molecular precursors", Inorganic Chemistry Communications, vol. 7, No. 3, Mar. 1, 2004, pp. 370-373.

Wan, et al., "Room-temperature synthesis and seebeck effect of lead chalcogenide nanocubes", Solid State Sciences, vol. 12, No. 1, Jan. 1, 2010, pp. 123-127.

Gao, et al., "The synthesis of newly modified CdTe quantum dots and their application for improvement of latent fingerprint detection", Nanotechnology, vol. 22, No. 7, Jan. 14, 2011, pp. 1-9.

Ramalingam et al., "Structural and property studies of CdSe crystalline nanorods synthesized by a solvothermal method", Journal of Crystal Growth, vol. 311, No. 11, May 15, 2009, pp. 3138-3142.

Shen, et al., "Facile preparation and upconversion luminescence of graphene quantum dots", Chemical Communications, vol. 47, No. 9, Jan. 1, 2011, pp. 2580-2582.

European Patent Office, Communication dated Apr. 29, 2014 issued in counterpart European Application No. 12188399.5.

* cited by examiner

NANOPARTICLES AND METHODS OF MANUFACTURING THE SAME

CROSS-REFERENCE TO RELATED APPLICATIONS

This application claims the benefit of Korean Patent Application No. 10-2011-0106637, filed on Oct. 18, 2011, in the Korean Intellectual Property Office, the disclosure of which is incorporated herein in its entirety by reference.

BACKGROUND

1. Field

The present disclosure relates to nanoparticles and methods of manufacturing the same, and more particularly, to nanoparticles comprising an inorganic capping agent and methods of manufacturing the same.

2. Description of the Related Art

A quantum dot (sometimes abbreviated as "QD" throughout the application) or a nanocrystal is a crystal structure of a dimension from a few to several ten nanometers, of which properties vary depending on its size. A semiconductor QD demonstrates properties between those of bulk semiconductors of the same material and those of discontinuous molecules. Since its physical, chemical, and electrical properties may be controlled by changing the size of the same material due to quantum confinement effects and large surface to volume ratios, a nanoparticle has received great interest for a new method of controlling properties of a material and a new material.

A typical nanoparticle, of which dimension varies from several to several hundred nanometers, may be comprised of two or three main parts: the middle core part which is a single crystal, of which the diameter may be about one to several ten nanometers, a shell or multiple shells, and a coating region or a coating layer of ligands formed on a surface of the core or the shell. Among preparation methods of nanoparticles, a wet-chemical synthesis method, which makes colloidal nanoparticle core, may produce a mass amount of uniformly nano-sized particles at a low cost.

Single-core semiconductor nanoparticles, which contain a single semiconductor material along with an outer organic passivating (or capping) layer, may have relatively low quantum efficiencies due to electron-hole recombination occurring at defects and dangling bonds situated on the nanoparticle surface.

One method to eliminate defects and dangling bonds is to grow a second inorganic material, having a wider band-gap and small lattice mismatch to that of the core material, epitaxially on the surface of the core particle to produce a "core-shell" particle. One example is ZnS grown on the surface of a CdSe core to provide a CdSe/ZnS nanoparticle.

Another approach is to prepare a core/multi-shell structure where the "electron-hole" pair is confined to a single shell layer such as the quantum dot-quantum well structure. One example of such core/shell/shell structured nanoparticle is CdS/HgS/CdS.

The coordination about the final inorganic surface atoms in core, core/shell or core/multi shell nanoparticle is generally incomplete, with highly reactive atoms that are not fully coordinated leaving "dangling bonds" on the surface of the particle, which may lead to particle agglomeration. To overcome this problem, the core, core/shell or core/multishell is passivated (capped) with protecting organic groups. The outermost layer (or capping agent) of organic material helps to inhibit particle aggregation and also further protects the nanoparticle from its surrounding chemical environment. It also provides chemical linkage to other inorganic, organic or biological material.

However, the organic passivating layer (or capping layer) coated on a surface of the core or the shell of the nanoparticle act as an insulating barrier layer, causing a decrease in electric conductivity of the nanoparticle, which limits actual industrial applications of the semiconductor nanoparticles to various electronic devices such as a light-emitting diode, a solar cell, a transistor, and the like. If the organic capping layer is removed, a luminous efficiency of the nanoparticles may decline due to effects of dangling bonds, surface defects, etc. on the surface of the nanoparticle, or optical and electrical properties may decline due to charge carriers trapped on the surface of the nanoparticle. Also, removing the organic capping layer causes aggregation or fusion of nanoparticles and destabilizes the nanoparticles.

Recently, Science 2009, 324, 1417-1420 reported a research about replacing organic ligands of nanoparticles with metal chalcogenide complexes ("MCC"). The MCC have an electrical charge, and like the organic ligands, they function as a capping agent to form a coating layer on the surface of the nanoparticles in a solution and stabilize the colloidal nanoparticles in the solution. However, the research uses a hydrazine solvent which is highly toxic and highly explosive when exposed to air, which makes it difficult to apply the method to industrial fabrication process.

Therefore, there has been a need for a safe and efficient fabrication method of nanoparticles with an inorganic capping layer. nanoparticle

SUMMARY

Provided is nanoparticles with an inorganic capping layer which have a good electrical conductivity and stability.

Provided are methods of manufacturing nanoparticles with an inorganic capping layer which have a good electrical conductivity and stability in a less toxic and safe way.

Additional aspects will be set forth in part in the description which follows and, in part, will be apparent from the description, or may be learned by practice of the presented embodiments.

According to an embodiment, there is provided a method for producing nanoparticles comprising inorganic ligands, the method including replacing organic ligands coupled to a surface of nanoparticles with the inorganic ligands to give the nanoparticles containing the inorganic ligands coupled to a surface of the nanoparticles, wherein the replacement is performed in a solvent containing the inorganic ligands and the nanoparticles coupled with the organic ligands, and wherein the inorganic ligands are a metal chalcogenide complex hydrazine hydrate.

The solvent may be a mixed solvent of a first solvent which contains the metal chalcogenide complex hydrazine hydrate dissolved therein and a second solvent which contains the nanoparticles coupled with the inorganic ligands dissolved therein. The replacement is performed by stirring the mixed solvent. According to the current embodiment, the first solvent may be different from the second solvent, or may be the same as the second solvent. For example, the first solvent may be a hydrazine hydrate and the second solvent may be an organic solvent. In another exemplary embodiment, the first solvent may be a polar organic solvent and the second solvent may be a non-polar organic solvent. The first solvent and the second solvent may be the same and may include a polar organic solvent. The polar organic solvent may be one which dissolves or disperses the metal chalcogenide complex hydrazine hydrate and the nanoparticles coupled with the organic ligands. According to another aspect of the present invention, nanoparticles each may include a nanoparticle core of a semiconductor material; and an inorganic capping layer including hydrazine hydrate on a surface of the nanoparticle core.

According to another aspect of the present invention, a method of manufacturing nanoparticles may include preparing a solution comprising a metal chalcogenide complexes (MCC) hydrazine hydrate; providing a first organic solution of first organic ligands-capped nanoparticles; forming a mixed solution by mixing the MCC hydrazine hydrate solution and the first organic solution of the first organic ligands-capped nanoparticles; and allowing substituting the first organic ligands of the nanoparticles with the MCC hydrazine hydrate by, for example stirring the mixed solution.

According to another aspect of the present invention, a method of manufacturing nanoparticles may include preparing a second organic solution of MCC hydrazine hydrate; providing a second organic solution of second organic ligands-capped nanoparticles; forming a mixed solution by mixing the second organic solution of the MCC hydrazine hydrate and the second organic solution of the second organic ligands-capped nanoparticles; and allowing substituting the second organic ligands of the nanoparticles with the MCC hydrazine hydrate by, for example stirring the mixed solution.

According to another aspect of the present invention, a method of manufacturing nanoparticles may include preparing a second organic solution of MCC hydrazine hydrate; providing a first organic solution of nanoparticles with first organic ligands; forming a mixed solution by mixing the second organic solution of the MCC hydrazine hydrate and the first organic solution of the nanoparticles with the first organic ligands; and exchanging the first organic ligands of the nanoparticles with ligands of the MCC hydrazine hydrate by stirring the mixed solution.

By substituting organic ligands of organic ligands-capped nanoparticles with inorganic ligands such as MCC, electrical properties of the nanoparticles may be improved, and the use of a solvent other than hydrazine allows manufacturing inorganic ligand-capped nanoparticles, in a less toxic and safe way.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description.

In the present application, the terms "ligand capped nanoparticle(s)," "ligand coated nanoparticle(s)," ligand passivated nanoparticle(s)," "nanoparticle(s) coated with a ligand," "nanoparticle(s) passivated with a ligand," "nanoparticle(s) capped with a ligand," and "nanoparticle(s) coupled with a ligand" are interchangeably used to mean that ligands are coupled or bound to a surface of nanoparticles. Therefore, it is understood that the ligand coat, ligand capping, or ligand passivating layer does not need to be continuous.

In the present application, the words "solution" and "dispersion" are sometimes interchangeably used to indicate a liquid made of a solute (here, for example, MCC hydrazine hydrate or organic ligand-capped nanoparticles) and a solvent which dissolves or disperses the solute.

In the present application, the word "stirring" is used to include, but is not limited to, stirring, agitating or vortex a mixed solvent by a various means known in the art so that the desired replacement of ligands on the surface of the nanoparticles may occur.

Nanoparticles in the present invention refer to nano-sized particles containing an elemental semiconductor or a compound semiconductor composed of particles of a size in a range of up to several ten nanometers. In an embodiment, the nanoparticle may be quantum dot of about 1 nm-about 10 nm. The nanoparticles in the present invention may have a core-shell structure, and each of a core and a shell may be formed of one or more layers. For example, the nanoparticles may have a core-shell or a core-shell-shell structure.

Phase transfer in the present invention means a phenomenon: when an interface is formed between two liquid phases as in solvent extraction, nanoparticles having first ligands in first liquid phase exchange the first ligands with second ligands in second liquid phase at a liquid interface and transfer to the second liquid phase. Thus, the nanoparticles after phase transfer are present in the second liquid phase and have the second ligands.

The ligands of the nanoparticles in the present invention may be single compounds or may be formed of 2 or more types of compounds.

Hereinafter, a inorganic ligand-capped nanoparticles according to an embodiment will be explained in detail.

Figure 1:
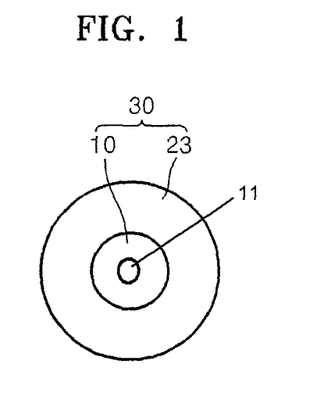
FIG. 1 is a schematic diagram illustrating an inorganic ligand-capped nanoparticle, according to an embodiment.

FIG. 1 is a schematic diagram illustrating a nanoparticle with inorganic ligands (hereinafter, sometimes referred to as "inorganic ligand coated nanoparticle" or "inorganic ligand capped nanoparticle") 30, according to an embodiment. Referring to FIG. 1, the inorganic ligand coated nanoparticle 30 includes a nanoparticle core 10 which is formed of a semiconductor material; and an inorganic ligand (sometimes referred to as "inorganic coat") 23 passivated on a surface of the nanoparticle core 10, in which the ligands are a metal chalcogenide complexes (MCC) hydrazine hydrate.

The semiconductor material of the nanoparticle core 10 may be formed of, for example, a Group II-VI semiconductor compound, a Group III-V semiconductor compound, a Group IV-VI semiconductor compound, a Group IV element or compound, or a combination thereof. The Group II-VI semiconductor compound may be, for example: a binary compound such as CdS, CdSe, CdTe, ZnS, ZnSe, ZnTe, ZnO, HgS, HgSe, HgTe or a combination thereof; a ternary compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe or a combination thereof; or a quaternary compound such as CdHgZnTe, CdZnSeS, CdZnSeTe, CdZnSTe, CdHgSeS, CdHgSeTe, CdHgSTe, HgZnSeS, HgZnSeTe, HgZnSTe or a combination thereof. The Group III-V semiconductor compound may be: for example, a binary compound such as GaN, GaP, GaAs, GaSb, AlN, AlP, AlAs, AlSb, InN, InP, InAs, InSb or a combination thereof; a ternary compound such as GaNP, GaNAs, GaNSb, GaPAs, GaPSb, AlNP, AlNAs, AlNSb, AlPAs, AlPSb, InNP, InNAs, InNSb, InPAs, InPSb, GaAlNP or a combination thereof; or a quaternary compound such as GaAlNAs, GaAlNSb, GaAlPAs, GaAlPSb, GaInNP, GaIn-NAs, GaInNSb, GaInPAs, GaInPSb, InAlNP, InAlNAs, InAlNSb, InAlPAs, InAlPSb or a combination thereof. The Group IV-VI semiconductor compound may be: for example, a binary compound such as SnS, SnSe, SnTe, PbS, PbSe, PbTe or a combination thereof; a ternary compound such as SnSeS, SnSeTe, SnSTe, PbSeS, PbSeTe, PbSTe, SnPbS, SnPbSe, SnPbTe or a combination thereof; or a quaternary compound such as SnPbSSe, SnPbSeTe, SnPbSTe or a combination thereof. The Group IV element or compound may be, for example, Si, Ge, SiC, SiGe, or a combination thereof. The nanoparticle 10 may have a core-shell structure. Each of the core 11 and the shell 12 (see FIG. 1A) may be formed of a single layer or of two or more layers. For structure, and, for example, formed of CdSe/ZnS or CdSe/CdS/ZnS.

The MCC hydrazine hydrate is coordinately bonded to the surface of the nanoparticle 10 to form a coat 23. The metal chalcogenides complex or MCC, suitable as an inorganic ligand, are compounds consisting of a metal and an element which is a member of the chalcogen column of the periodic table. While oxygen is a member of the chalcogens, the term metal chalcogenide used in the instant application with regard to an inorganic ligand refers to compounds of a metal with sulfur, selenium or tellurium, and polonium. Exemplary metals include Ga, In, Ti, Sn, Pb, Bi, Zn, Cd, Hg, Cu, Ag, Au, Ni, Pd, Pt, Co, Rh, Ir, Fe, Ru, Os, Mn, Tc, Re, Cr, Mo, W, v, Nb, Ta, Ti, Zr, Hf, Sc, and Y. Metal chalcogenides may include a semiconductor cadmium sulfide, cadmium selenide, $Sn_2S_6$, $Sn_2Se_6$, $In_2Se_4$, $In_2Te_3$, $Ga_2Se_3$, $CuInSe_2$, $Cu_7S_4$, $Hg_3Se_4$, $Sb_2Te_3$, or ZnTe. Among these, $Sn_2S_6$, $Sn_2Se_6$, $In_2Se_4$, $In_2Te_3$, $Ga_2Se_3$, $CuInSe_2$, $Cu_7S_4$, $Hg_3Se_4$, $Sb_2Te_3$, or ZnTe may be usefully employed in embodiments of the invention. The MCC as an inorganic ligand to be bound by a coordinate bond to the surface of the core or the shell of a core-shell or core-shell-shell nanoparticle is different from the semiconducting metal chalcogenide forming the core or the shell. Exemplary hydrazine hydrates may include, but are not limited to, monohydrate, dihydrate, trihydrate, tetrahydrate, pentahydrate, or hexahydrate of hydrazine. Exemplary hydrazine solvates may include, but are not limited to, hydrazine dihydrochloride ($N_2H_4$-2HCl), hydrazine monohydrochloride, hydrazine monohydrobromide or hydrazine acetate.

According to another embodiment, a nanoparticle solution may be provided by dissolving the nanoparticles 30 described above in an organic solvent such as ethanolamine, dimethyl sulfoxide (DMSO), dimethylformamide (DMF), or formamide solvent.

Figure 2A:
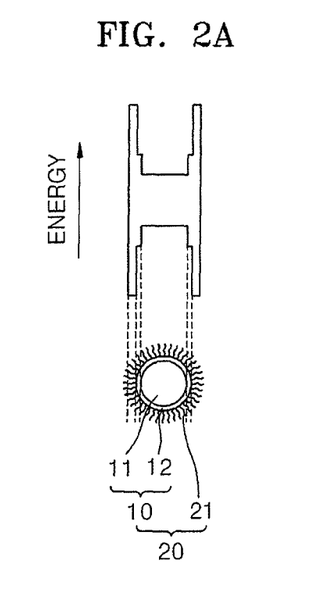
FIG. 2A is an energy diagram illustrating electronic energy of an organic ligand-capped nanoparticle.
Figure 2B:
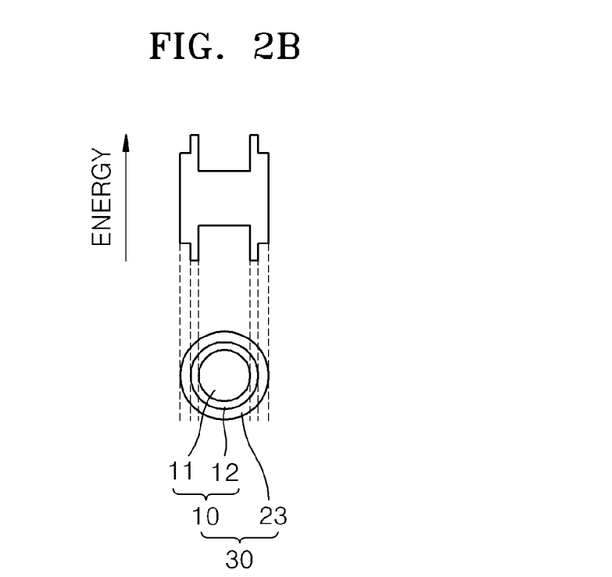
FIG. 2B is an energy diagram illustrating electronic energy of an inorganic ligand-capped nanoparticle, according to an embodiment.

FIG. 2A is an energy diagram illustrating electronic energy of an organic ligand coated nanoparticle 20, and FIG. 2B is an energy diagram illustrating electronic energy of an inorganic ligand coated nanoparticle 30. Referring to FIG. 2A, energy levels of organic ligand coat 21 of the organic ligand coated nanoparticle 20, which is composed of a nanoparticle 10 formed of a core 11 and a shell 12 and the organic ligands 21 on the surface of the nanoparticle 10, are relatively higher than energy levels of the core 11 and the shell 12. On the other hand, referring to FIG. 2B, the nanoparticle with the inorganic ligands 30, which is composed of a nanoparticle 10 formed of a core 11 and a shell 12 and the inorganic ligands 23 on the surface of the nanoparticle 10, has lower energy levels of the inorganic ligands 23 than energy levels of the shell 12. Therefore, inorganic ligands-coated nanoparticles do not have a high energy barrier caused by organic ligands 21 of organic ligands-passivated nanoparticle 20, and thus can have an improved conductivity.

Hereinafter, methods of manufacturing inorganic ligand-coated nanoparticles according to embodiments, will be explained in detail.

Figure 3:
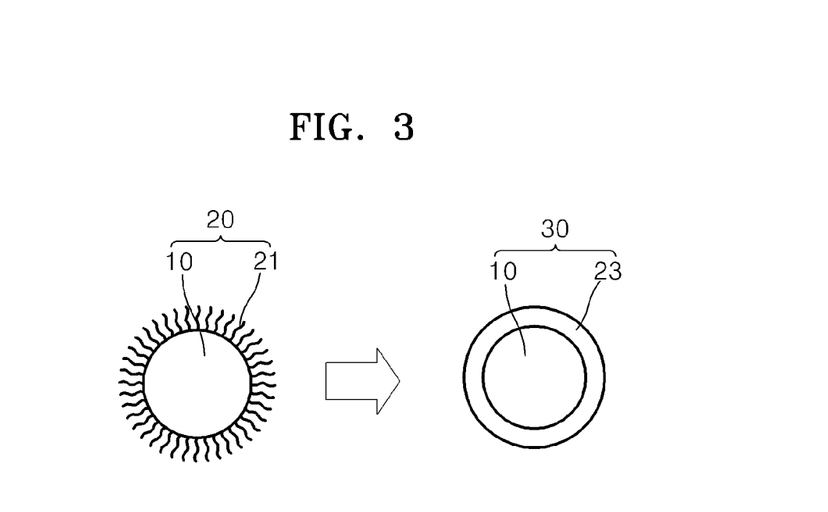
FIG. 3 is a diagram conceptually illustrating a method of manufacturing an inorganic ligand-capped nanoparticle, according to an embodiment.

FIG. 3 is a diagram conceptually illustrating a method of manufacturing nanoparticles coated with inorganic ligands, according to an embodiment. Referring to FIG. 3, a nanoparticle coated with inorganic ligands 30 may be prepared by providing organic ligands-passivated nanoparticles, and replacing organic ligands 21 of the organic ligands-passivated nanoparticle 10 with inorganic ligands 23. The inorganic ligands 23 may be an MCC hydrazine hydrate. The substitution of organic ligands with inorganic ligands may be done via phase transfer between a first solution or dispersion comprising inorganic ligand compounds and a second solution or dispersion comprising nanoparticles coated with organic ligands in an embodiment. According to other embodiment, the substitution of ligands may be done in a single solvent where nanoparticles coated with organic ligands and an excess amount of inorganic ligand compounds are present.

Figure 4:
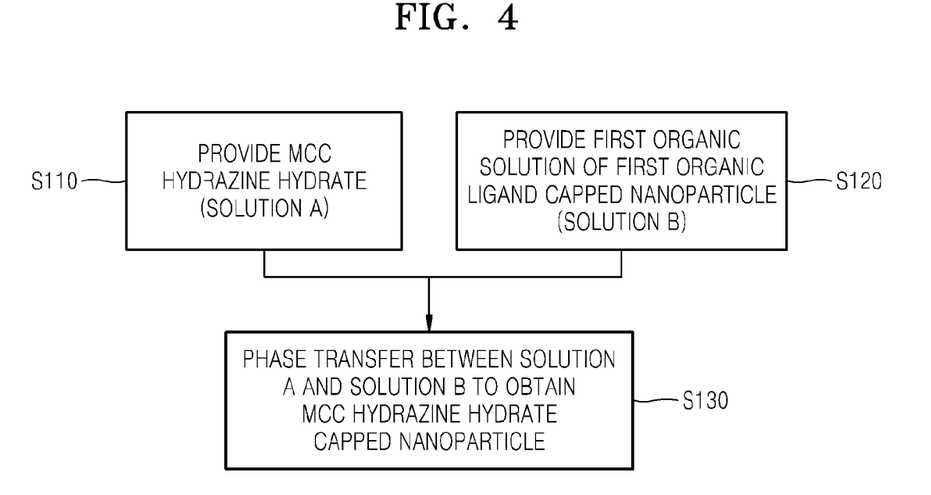
FIG. 4 is a flowchart for describing a method of manufacturing an MCC hydrazine hydrate ligand-capped nanoparticle, according to an embodiment.

FIG. 4 is a flowchart for describing a method of manufacturing nanoparticles coated with MCC hydrazine hydrate ligands, according to an embodiment.

Referring to FIG. 4, an MCC hydrazine hydrate solution (solution A) is prepared (S110). The MCC hydrazine hydrate is a compound comprised of an MCC and hydrazine hydrate, which are bound to each other. The MCC hydrazine hydrate may be dissolved or dispersed into an appropriate solvent to give an MCC hydrazine hydrate solution. For this, first, a chalcogenide hydrazine hydrate solution or chalcogenide hydrazine hydrate dispersion is prepared by dissolving or dispersing chalcogen powder (non-limiting examples include S, Se, or Te) in hydrazine hydrate ($N_2H_4.nH_2O$). For example, sulfur powder may be dissolved in a hydrazine hydrate solution to prepare a sulfur hydrazine monohydrate solution. In an embodiment, hydrazine monohydrate may contain about 60-70, or about 64-65 wt % hydrazine. In another embodiment, hydrazine hydrates may contain about 50-60 wt %, or about 55% hydrazine. It can be used as a diluted solution or a stock solution. For example, a hydrazine hydrate solution containing hydrazine up to 65 wt % in 1M solution may be diluted.

Next, metal powder is added to the chalcogenide hydrazine hydrate solution to be reacted. The metal may include a metal element or a metal compound. For example, the metal may include Sn, Ga, $Cu_2S$, GeS, $Sb_2Se_3$, $Sb_2Te_3$, $In_2Se_3$, ZnTe, $In_2Te_3$, etc. An additional hydrazine hydrate solution along with the metal powder may be added. The reaction temperature may be in a range from room temperature to about 200° C. Since hydrazine hydrate is a strong reducing agent, MCC may be synthesized in the hydrazine hydrate solution. Also, the MCC may bind to the hydrazine hydrate in the hydrazine hydrate solution to form MCC hydrazine hydrate. The MCC hydrazine hydrate may be an MCC hydrazine monohydrate, MCC hydrazine dihydrate, MCC hydrazine trihydrate, MCC hydrazine tetrahydrate, MCC hydrazine pentahydrate, MCC hydrazine hexahydrate, or a combination thereof. The hydrazine hydrate solution may be safely used in MCC synthesis due to its less toxicity than hydrazine and non-explosiveness.

The MCC hydrazine hydrate solution ("solution A") may be prepared by removing precipitates from the reaction mixture using, for example, centrifugation or filtration after the reaction. In this exemplary embodiment, hydrazine hydrate is employed as a solvent for the MCC hydrazine hydrate solution. For example, a hydrazine monohydrate solution of $Sn_2S_6$, $Sn_2Se_6$, $In_2Se_4$, $In_2Te_3$, $Ga_2Se_3$, $CuInSe_2$, $Cu_7S_4$, $Hg_3Se_4$, $Sb_2Te_3$, or ZnTe may be prepared.

A first organic solution or dispersion containing first organic ligand-capped nanoparticle ("solution B") is prepared (S120). The solution B is a solution in which nanoparticles capped with first organic ligands are dissolved or dispersed in a first organic solvent. A nanoparticle may be formed of, for example, a Group II-VI semiconductor compound, a Group III-V semiconductor compound, a Group IV-VI semiconductor compound, a Group IV element or compound, or a combination thereof. The Group II-VI semiconductor compound may be: for example a binary compound such as CdS, CdSe, CdTe, ZnS, ZnSe, ZnTe, ZnO, HgS, HgSe, HgTe, or a combination thereof; a ternary compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, or a combination thereof; or a quaternary compound such as CdHgZnTe, CdZnSeS, CdZnSeTe, CdZnSTe, CdHgSeS, CdHgSeTe, CdHgSTe, HgZnSeS, HgZnSeTe, HgZnSTe, or a combination thereof. The Group III-V semiconductor compound may be, for example: a binary compound such as GaN, GaP, GaAs, GaSb, AlN, AlP, AlAs, AlSb, InN, InP, InAs, InSb, or a combination thereof; a ternary compound such as GaNP, GaNAs, GaNSb, GaPAs, GaPSb, AlNP, AlNAs, AlNSb, AlPAs, AlPSb, InNP, InNAs, InNSb, InPAs, InPSb, GaAlNP, or a combination thereof; or a quaternary compound such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof. The Group IV-VI semiconductor compound may be: for example, a binary compound such as SnS, SnSe, SnTe, PbS, PbSe, PbTe, or a combination thereof; a ternary compound such as SnSeS, SnSeTe, SnSTe, PbSeS, PbSeTe, PbSTe, SnPbS, SnPbSe, SnPbTe, or a combination thereof; a quaternary compound such as SnPbSSe, SnPbSeTe, SnPbSTe, or a combination thereof. The Group IV element or compound may be, for example, Si, Ge, SiC, SiGe, or a combination thereof. For example, in an exemplary embodiment, the nanoparticle may have a structure of core/shell/shell of CdSe/CdS/ZnS.

The nanoparticles are dispersed in the form of colloid in the first organic solution, and the first organic ligands are coordinately bonded on surfaces of the nanoparticles. That is, each of the nanoparticles is passivated with the first organic ligands. The first organic ligands, for example, but are not limited thereto, may include trioctylphosphine (TOP), trioctylphosphine oxide (TOPO), oleic acid, oleylamine, octylamine, trioctylamine, hexadecylamine, octanethiol, dodecanethiol, hexylphosphonic acid (HPA), tetradecylphosphonic acid (TDPA), octylphosphin acid (OPA) or a combination thereof. The first solvent of the first organic solution is immiscible with solution A containing the MCC hydrazine hydrate. The first solvent may include, but is not limited thereto, cyclohexane, hexane, chloroform, toluene, octane, chlorobenzene or a combination thereof. The first solvent may be the same compound as the first organic ligands.

The first organic ligands of the nanoparticles may be replaced with the MCC hydrazine hydrate ligands by a phase transfer reaction, for example by mixing the solution B with solution A (S130). The phase transfer may be performed by mixing solution B and solution A with stirring, vortex, agitation, or combinations thereof. The phase transfer may be promoted by adding hydrazine hydrate solution to the mixture. For example, solution A may be added to a hydrazine hydrate solution, followed by the addition of the first organic solution of the first organic ligand-capped nanoparticles. Thy hydrazine hydrate solution may be hydrazine monohydrate, hydrazine dihydrate, hydrazine trihydrate, hydrazine tetrahydrate, hydrazine pentahydrate, hydrazine hexahydrate, or a combination thereof. As the solvent (i.e., hydrazine hydrate) of the MCC hydrazine hydrate solution (or dispersion) is immiscible with the solvent for the first organic ligand capped nanoparticle solution, when two solutions are combined, it is separated into two layers (or phases): a first organic solution layer of an upper portion and a hydrazine hydrate layer of a lower portion. The first organic solution layer of the upper portion may include the first organic ligands-capped nanoparticles, and the hydrazine hydrate layer of the lower portion may include an excess amount of MCC. By stirring the combined solutions, the organic ligands capped nanoparticles in the first organic solution layer move to the hydrazine hydrate layer, and the organic ligands passivating the nanoparticles may be replaced with the MCC ligands. The stirring temperature may be in a range between room temperature to 200° C. Therefore, by allowing the nanoparticles to move between two phases of immiscible solvents, substitution of ligands which are bound to the surface of the nanoparticles occurs, giving nanoparticles of a semiconductor compound passivated with MCC ligands.

Figure 5:
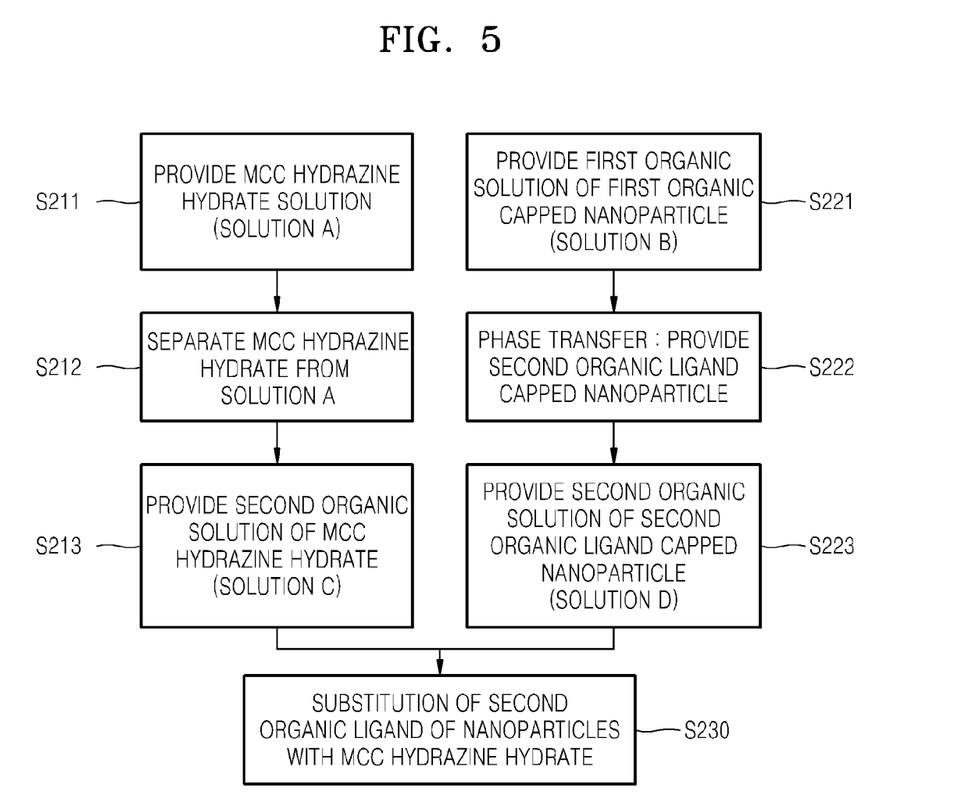
FIG. 5 is a flowchart for describing a method of manufacturing an MCC hydrazine hydrate ligand-capped nanoparticle, according to another embodiment.

FIG. 5 is a flowchart schematically describing a method of manufacturing nanoparticles capped with MCC hydrazine hydrate ligands, according to another embodiment. The current embodiment is different from the embodiment of FIG. 4 in the sense of replacing the solvent of the first MCC hydrazine hydrate solution, exchanging organic ligands of a nanoparticle to new organic ligands, followed by converting the solvent of the nanoparticle solution.

Referring to FIG. 5, an MCC hydrazine hydrate solution (solution A) is prepared (S211). The process is as same as the preparation process S110 of the MCC hydrazine hydrate solution described in regard to the embodiment of FIG. 4.

Subsequently, the MCC hydrazine hydrate is separated from the solution A (S212). As described above, the MCC hydrazine hydrate is a compound composed of MCC and hydrazine hydrate. For example, the MCC hydrazine hydrate may be separated from hydrazine hydrate solvent by blowing an inert gas such as nitrogen gas to the solution A to evaporate hydrazine hydrate solvent. Or, for example, an excessive amount of a solvent which does not dissolve MCC may be added to solution A, and then solution A may be centrifuged to separate the MCC hydrazine hydrate. As the solvent which does not dissolve MCC, methanol, ethanol, butanol, or acetonitrile may be exemplified.

A second solution (or dispersion) of MCC hydrazine hydrate (solution C) may be prepared by dispersing the separated MCC hydrazine hydrate in a second solvent, which may be an organic solvent (S213). The solvent may be an organic solvent that may dissolves (disperses) both MCC and nanoparticles. The second solvent may be an organic solvent with a polarity, such as ethanolamine, DMSO (dimethylsulfoxide), DMF (dimethylformamide), formamide, etc.

A first solution of the first organic ligand-capped nanoparticle (solution B) is prepared (S221). The process is as same as the preparation process S121 of the solution B described in regard to the embodiment of FIG. 4.

Subsequently, first organic ligands are replaced with second organic ligands via phase transfer of the nanoparticles (S222). For the ligands exchange, the solution B may be added and stirred in a third organic solution including an excess amount of the second organic ligands. The second organic ligands are ligands that may be dissolved or dispersed in a second organic solvent which may dissolve (or disperse) MCC hydrazine hydrate. The second organic ligands may be ligands with a polarity such as mercaptopropionic acid (MPA), cysteamine, mercaptoacetic acid, etc. The third organic solvent may be, for example, chloroform, chlorobenzene, etc. The first organic ligands of the nanoparticles are replaced with the second organic ligands due to an equilibrium reaction in the third organic solution including an excess amount of the second organic ligands. The second organic ligands may be dissolved in both the second organic solvent and the third organic solvent. Since the second organic ligands may be dissolved in the second organic solvent in which MCC hydrazine hydrate is dissolved, the substitution of ligands of nanoparticles in the same type of solvent is enabled.

Nanoparticles capped with the second ligands are dispersed in a second organic solvent to prepare a second organic solution of the second organic ligand-capped nanoparticles (solution D) (S223). For this, first, the nanoparticles capped with the second organic ligands are separated from the third organic solution. For example, the third organic solution including the nanoparticles capped with the second organic ligands is centrifuged to precipitate and separate the nanoparticles. Also, the solution D may be prepared by dispersing the separated nanoparticles in an organic solvent which is the same as the second organic solvent in which MCC hydrazine hydrate are dissolved (or dispersed) in (S213).

The second organic ligands of the nanoparticles are replaced with the MCC hydrazine hydrate ligand by mixing the solution D into the solution C (S230). Mixing the solution C and the solution D does not cause a phase separation because the solvents of the solutions are the same. Since a phase separation does not occur, byproducts at the interface between the hydrazine hydrate solution and the first organic solution are not produced, and thus, damage on surfaces of the nanoparticles due to the byproducts which may be produced during the replacement of ligands of the nanoparticles may be prevented. Moreover, since hydrazine hydrate as a solvent which by itself may reduce a luminescence efficiency of nanoparticles is not present during the formation of MCC hydrazine hydrate-capped nanoparticles, a reduction in luminescence efficiency may be inhibited.

The second organic ligands passivating the nanoparticle may be replaced with the MCC hydrazine hydrate ligands by stirring, vortex, or agitating the mixed solution. The stirring temperature may be in a range between room temperature to 200° C. When the combined solution is stirred, the second organic ligands passivating the nanoparticles in the second organic solution may be replaced with the MCC hydrazine hydrate ligands in the same solvent. Therefore, a nanoparticle of a semiconductor compound passivated with the MCC hydrazine hydrate ligands may be manufactured by the ligands replacement in a single solvent.

Since the current embodiment uses the same organic solvents for solution C containing MCC hydrazine hydrate ligands and for solution D containing organic ligands-capped nanoparticles, a subreaction at an interface between different solvents does not occur. Also, the current embodiment may have a broader applicability because various factors limiting the applicability of phase transfer reaction, including for example, selecting a degree of polarity of each solvent and portions of the solvents are not applied to this method.

Figure 6:
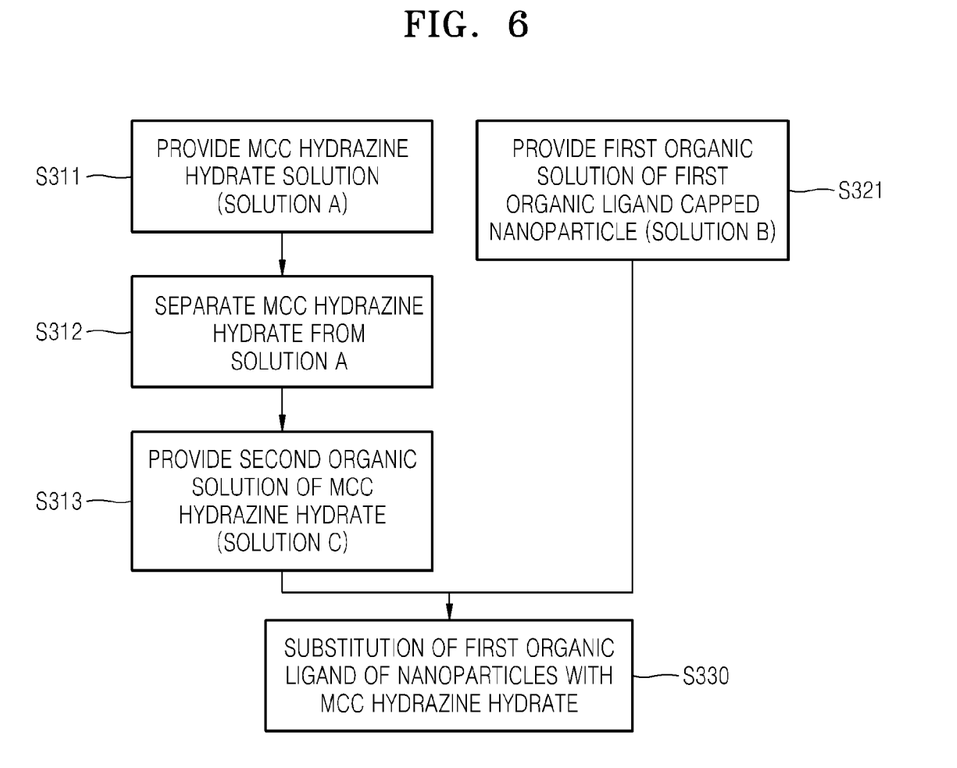
FIG. 6 is a flowchart for describing a method of manufacturing an MCC hydrazine hydrate ligand-capped nanoparticle, according to another embodiment.

FIG. 6 is a flowchart for describing a method of manufacturing nanoparticles capped with MCC hydrazine hydrate ligands, according to another embodiment. The present embodiment is different from the embodiment of FIG. 4 in the sense that the solvent of an MCC hydrazine hydrate solution is replaced with a second organic solvent. The current embodiment is different from the embodiment of FIG. 5 in the sense of not performing a surface reforming of a nanoparticle (S222) and a solvent replacement a nanoparticle solution (S223).

Referring to FIG. 6, an MCC hydrazine hydrate solution (solution A) is prepared (S311). Next, MCC hydrazine hydrate is isolated from the solution A (S312). Then, a second organic solution of MCC hydrazine hydrate (solution C) is prepared by dispersing the separated MCC hydrazine hydrate in a second organic solvent (S313). Each procedure of S311, S312, and S313 is same as each procedure of S211, S212, and S213 explained in regard to the embodiment of FIG. 5, except that the second organic solvent is not required to dissolve both of MCC hydrazine hydrate and first organic ligands-capped nanoparticles. An organic solvent which dissolves both of MCC hydrazine hydrate and nanoparticles of which surfaces are reformed with MCC hydrazine hydrate may also be used.

A first organic solution of the first organic ligand-capped nanoparticles (solution B) is prepared (S321). The procedure is the same as the preparation procedure S121 of the solution B explained in regards to the embodiment of FIG. 4. Unlike the embodiment of FIG. 5, the current embodiment does not perform the procedures of substituting the first organic ligands with second organic ligands and replacing a solvent of a nanoparticle solution.

The first organic ligands of the nanoparticle are substituted with the ligands of the MCC hydrazine hydrate by mixing the solution B into the solution C (S330). Phase separation may occur due to different solvents of the solution C and the solution B. For example, phase separation may occur when the solution C is polar, while the solution B is non-polar. The first organic ligands passivating the nanoparticle may be replaced with the MCC hydrazine hydrate ligands by stirring, vortex, agitating the combined solution. By the stirring, the nanoparticle in a first organic solution layer moves to a second organic solution layer, thus the first organic ligands passivating the nanoparticle may be replaced with the MCC hydrazine hydrate ligands. The stirring temperature may be in the range between room temperature to 200° C. Therefore, the nanoparticles of a semiconductor compound passivated with the MCC hydrazine hydrate may be prepared by ligands exchange in the different solvents.

In the current embodiment, impurities may be formed at the interface between the two different solvents due to an remnant of the first organic ligands and an imperfect ligands exchange reaction. However, the amount of the impurities formed is less than the amount of subreaction substance produced at the interface between the hydrazine hydrate solvent and the first organic solvent. It is speculated that the strong reducing power of hydrazine hydrate as a solvent may affect the surface of the nanoparticles. In the current embodiment, a reduction in the luminous efficiency of the nanoparticles due to the hydrazine hydrate solvent may be inhibited. The omission of the substitution of first organic ligands with second organic ligands of nanoparticles according to the current embodiment is expected to minimize any reduction in luminous efficiency which could occur due to a ligands substitution reaction, and the number of an entire reaction process is reduced, thus the overall ligand substitution may be fast and convenient.

Example 1

(a) Preparation of $Sn_2S_6$ Hydrazine Monohydrate Solution

1 M of sulfur hydrazine monohydrate solution was prepared by dissolving 0.32 g (10 mmol) of sulfur powder in 10 ml of hydrazine monohydrate solution (hydrazine content 64-65 wt %). 120 mg (1 mmol) of tin (Sn) powder was added to a mixed solution of 3 ml of the 1 M of sulfur hydrazine monohydrate solution and 1 ml of the hydrazine monohydrate and the mixture was allowed to react. The reaction took place at room temperature and the solution was stirred for about an hour. At the end of the reaction, a $Sn_2S_6$ hydrazine monohydrate solution was obtained by centrifugation to remove remaining precipitates from the reaction solution. The $Sn_2S_6$ hydrazine monohydrate solution contained $Sn_2S_6$ hydrazine monohydrate of which $Sn_2S_6$ and hydrazine monohydrate are bound to each other.

(b) Preparation of CdSe/CdS/ZnS Nanoparticle Cyclohexane Solution

A CdSe/CdS/ZnS nanoparticle cyclohexane solution with concentration of 5 mg/ml was prepared by dissolving (or dispersing) CdSe/CdS/ZnS nanoparticles in a cyclohexane solution by following a known method, for example the process reported in Advanced Materials, 2007, 19, 1927-1932. The CdSe/CdS/ZnS nanoparticle has a structure of CdSe core/CdS inner shell/ZnS outer shell. The CdSe/CdS/ZnS nanoparticles are capped with mixed organic ligands of oleic acid, trioctylphosphane ("TOP"), trioctylphosphine oxide ("TOPO"), trioctylamine, etc.

(c) Exchange of Ligands of CdSe/CdS/ZnS Nanoparticles

25 μl of the $Sn_2S_6$ hydrazine monohydrate solution of (a) was added to 2 ml of hydrazine monohydrate solution, then 2 ml of a cyclohexane solution containing CdSe/CdS/ZnS nanoparticles was added. The resulting mixed solution was separated into two phases: an upper portion of a cyclohexane layer and a lower portion of a hydrazine mono hydrate layer. The cyclohexane layer contained organic ligands-capped CdSe/CdS/ZnS nanoparticles, and the hydrazine monohydrate layer contained $Sn_2S_6$ hydrazine monohydrate ligands.

The phase-separated mixed solution was stirred for 72 hours at room temperature. After the stirring, the CdSe/CdS/ZnS nanoparticles were moved from the upper portion of the cyclohexane layer to the lower portion of the hydrazine monohydrate layer. While CdSe/CdS/ZnS nanoparticles were moving from the cyclohexane layer to the hydrazine monohydrate layer, the mixed organic ligands on the surface of CdSe/CdS/ZnS nanoparticles were exchanged with the $Sn_2S_6$ hydrazine monohydrate ligands.

Figure 7:
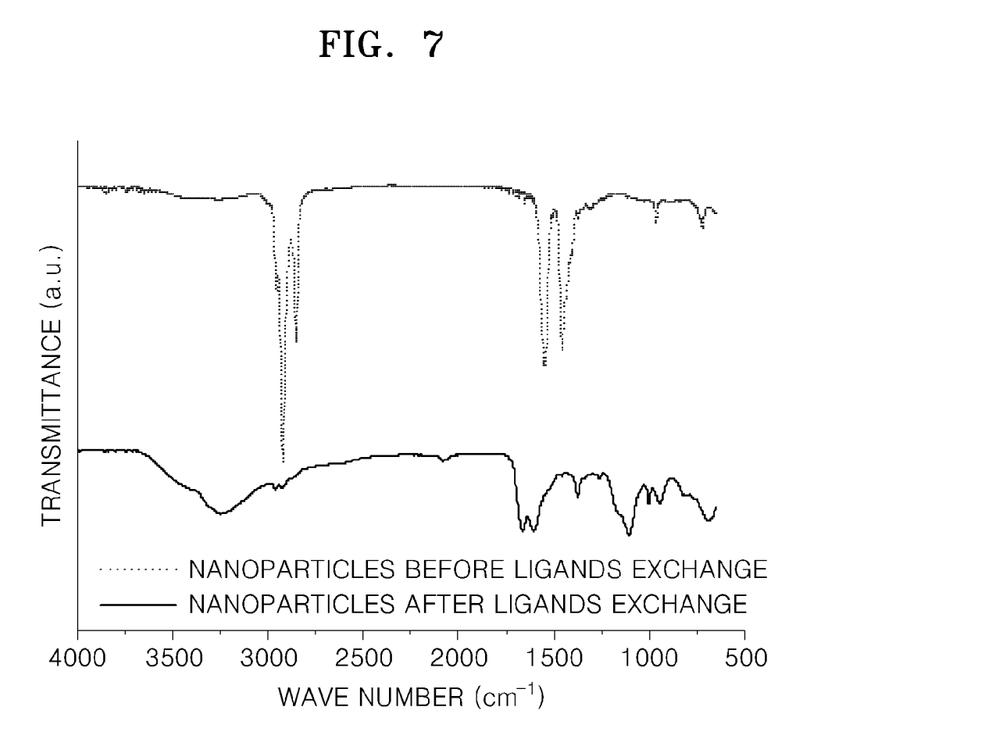
FIG. 7 is a Fourier transform infrared spectroscopy (FTIR) spectrum of the CdSe/CdS/ZnS nanoparticle before and after ligands exchange explained in Example 1.

FIG. 7 is a Fourier transform infrared spectroscopy (FTIR) spectrum of the CdSe/CdS/ZnS nanoparticles before and after ligands exchange of Example 1. In FIG. 7, the nanoparticles before ligands exchange were the CdSe/CdS/ZnS nanoparticles containing the mixed organic ligands, and the nanoparticles after the ligands substitution were the CdSe/CdS/ZnS nanoparticles after the reaction exchanging to the $Sn_2S_6$ hydrazine monohydrate ligand. The FTIR spectrum regarding each powder of nanoparticles was measured.

Referring to FIG. 7, a peak at around 3000 $cm^{-1}$ corresponding to C—H stretching, and peaks at around 1500 $cm^{-1}$ corresponding to C=O stretching and corresponding to C—H bending were present in the FTIR spectrum before ligands substitution. From these peaks, it was confirmed that the nanoparticles before ligands substitution were the nanoparticles with organic ligands. However, the peaks disappeared in the FTIR spectrum after ligands change. Therefore, it may be known that the organic ligands of the CdSe/CdS/ZnS nanoparticles were replaced with the Sn2S6 hydrazine monohydrate ligands.

A luminous efficiency of the CdSe/CdS/ZnS nanoparticles after ligands substitution of Example 1 was reduced to a level of about 25% of the CdSe/CdS/ZnS nanoparticles before ligands substitution. Such a reduction in the luminous efficiency of the CdSe/CdS/ZnS nanoparticles is speculated to be caused by damage on the surfaces of nanoparticles when the nanoparticles ligands were substituted as subreaction substances at an interface between the hydrazine monohydrate layer and the cyclohexane layer were produced. Also, a possibility that the hydrazine monohydrate itself may reduce the luminous efficiency of the nanoparticles may not be excluded.

Example 2

(a) Preparation of $Sn_2S_6$ Hydrazine Monohydrate Ethanolamine Solution

A $Sn_2S_6$ hydrazine monohydrate solution was prepared with the same procedures in Example 1. The $Sn_2S_6$ hydrazine monohydrate solution was dried with $N_2$ gas to remove hydrazine monohydrate solvent to leave $Sn_2S_6$ hydrazine monohydrate. The separated $Sn_2S_6$ hydrazine monohydrate was dissolved in ethanolamine to give an ethanolamine solution of $Sn_2S_6$ hydrazine monohydrate at a concentration of 16 mg/ml.

(b) Preparation of CdSe/CdS/ZnS Nanoparticle Ethanolamine Solution

A CdSe/CdS/ZnS nanoparticle cyclohexane solution with a concentration of 10 mg/ml was prepared by following the procedures of Example 1.2 ml of the CdSe/CdS/ZnS nanoparticle cyclohexane solution was added to 18 ml of 2M mercapto propionic acid (MPA) solution and stirred at 80° C. for 3 hours. Due to the reaction, mixed organic ligands of the surface of the CdSe/CdS/ZnS nanoparticles were replaced with MPA ligands.

Subsequently, the CdSe/CdS/ZnS nanoparticles exchanged with MPA ligands were precipitated by centrifugation. The precipitated CdSe/CdS/ZnS nanoparticles were re-dispersed (re-dissolved) in an ethanolamine to prepare a CdSe/CdS/ZnS nanoparticle ethanolamine solution with a concentration of 10 mg/ml.

(c) Substitution of Ligands of CdSe/CdS/ZnS Nanoparticles 0.2 ml of the $Sn_2S_6$ hydrazine monohydrate ethanolamine solution prepared in (a) was added to 2 ml of the CdSe/CdS/ZnS nanoparticle ethanolamine solution prepared in (b) and reacted by stirring for 8 hours at room temperature.

Figure 8:
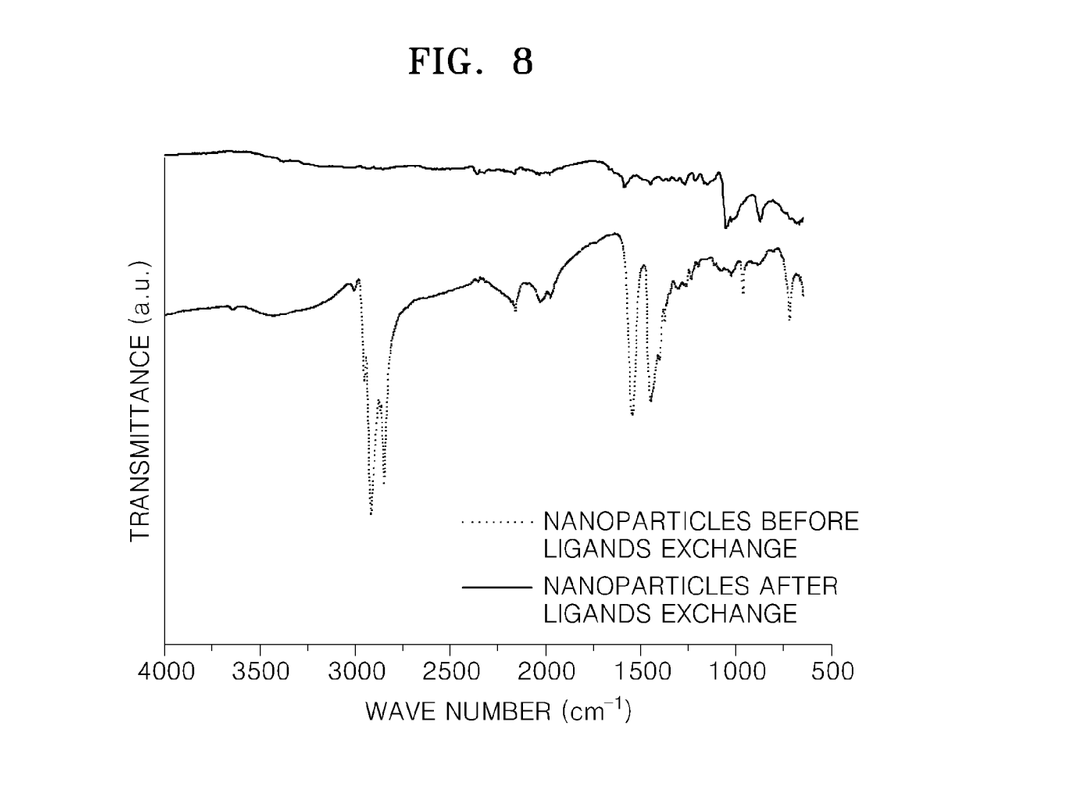
FIG. 8 is an FTIR spectrum of CdSe/CdS/ZnS nanoparticles before and after a ligands exchange reaction explained in Example 2.

FIG. 8 is an FTIR spectrum of CdSe/CdS/ZnS nanoparticles before and after a ligands substitution reaction of Example 2. The nanoparticles before the ligands substitution were CdSe/CdS/ZnS nanoparticles with MPA ligands, and the nanoparticles after the ligands substitution were CdSe/CdS/ZnS nanoparticles after the replacement reaction with $Sn_2S_6$ hydrazine monohydrate ligands. The FTIR spectrum regarding each powder of nanoparticles was measured.

Referring to the graph of FIG. 8, a peak at around 3000 $cm^{-1}$ corresponding to C—H stretching and a peak at around 1500 $cm^{-1}$ corresponding to C=O stretching were present in the FTIR spectrum before ligands exchange. However, the peaks disappeared in the FTIR spectrum after ligands exchange. Therefore, it may be known that the MPA ligands of the CdSe/CdS/ZnS nanoparticles were exchanged with the Sn2S6 hydrazine monohydrate ligands.

A luminous efficiency of the CdSe/CdS/ZnS nanoparticles after ligands exchange of Example 2 was reduced to a level of about 60% of the CdSe/CdS/ZnS nanoparticles with the mixed organic ligands. Such reduction in the luminous efficiency of the CdSe/CdS/ZnS nanoparticles is speculated to be caused by a reduction in a luminescence quantum yield during the substitution process of the ligands of the CdSe/CdS/ZnS nanoparticles with the MPA and the substitution process of the MPA with the ligands of the $Sn_2S_6$ hydrazine monohydrate.

Example 3

(a) Preparation of $Sn_2S_6$ Ethanolamine Solution

A $Sn_2S_6$ hydrazine monohydrate solution with a concentration of 16 mg/ml was prepared with the same procedures in Example 2.

(b) Preparation of CdSe/CdS/ZnS Nanoparticle Cyclohexane Solution

A CdSe/CdS/ZnS nanoparticle cyclohexane solution with a concentration of 10 mg/ml was prepared with the same procedures of Example 1.

(c) Substitution of Ligands of CdSe/CdS/ZnS Nanoparticle 0.2 ml of the $Sn_2S_6$ hydrazine monohydrate ethanolamine solution prepared in (a) was added to 2 ml of ethanol solution. 0.2 ml of the CdSe/CdS/ZnS nanoparticle cyclohexane solution prepared in (b) was added to 2 ml of cyclohexane solution mixed with the $Sn_2S_6$ hydrazine monohydrate ethanolamine solution and reacted for ligands exchange while stirring for 8 hours at room temperature.

Figure 9:
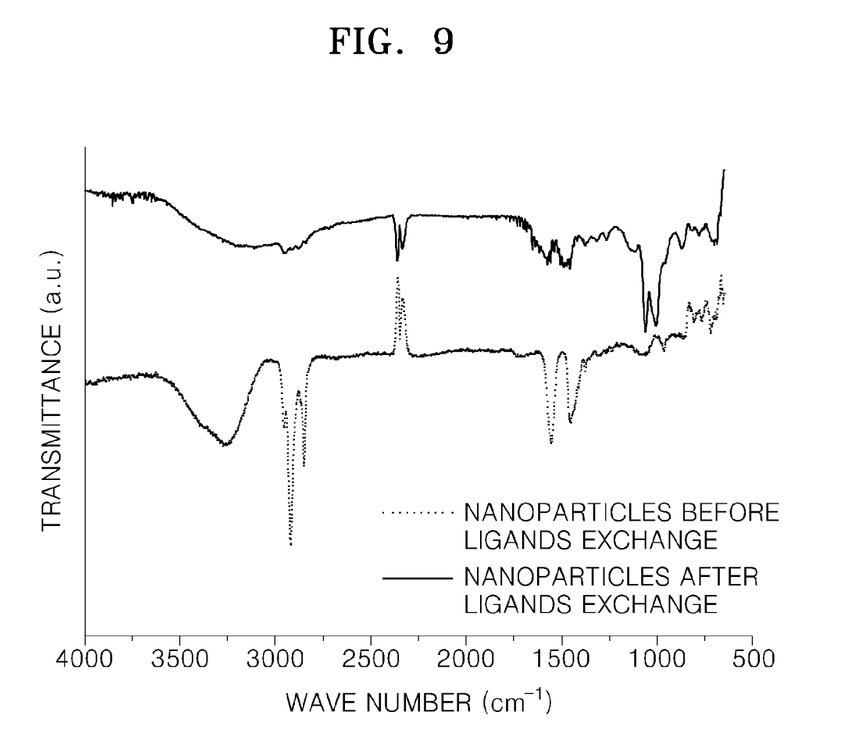
FIG. 9 is an FTIR spectrum of CdSe/CdS/ZnS nanoparticles before and after a ligands exchange reaction explained in Example 3.

FIG. 9 is an FTIR spectrum of CdSe/CdS/ZnS nanoparticles before and after a ligands exchange reaction of Example 3. The nanoparticles before the ligands exchange were the CdSe/CdS/ZnS nanoparticles with the mixed organic ligands, and the nanoparticles after the ligands exchange were the CdSe/CdS/ZnS nanoparticles after an exchange reaction to the $Sn_2S_6$ hydrazine monohydrate ligands. The FTIR spectrum regarding each powder of nanoparticles was measured.

Referring to FIG. 9, a peak at around 3000 $cm^{-1}$ corresponding to C—H stretching and a peak at around 1500 $cm^{-1}$ corresponding to C=O stretching were present in the FTIR spectrum before ligands exchange. However, the peaks were present very weakly in the FTIR spectrum after ligands exchange. Therefore, it may be known that the mixed organic ligands of the CdSe/CdS/ZnS nanoparticles were exchanged with the $Sn_2S_6$ hydrazine monohydrate ligands.

The examples were able to have the same reaction even when another hydrazine hydrate, such as hydrazine dihydrate, hydrazine trihydrate, or the like, were used instead of the hydrazine monohydrate.

Figure 10:
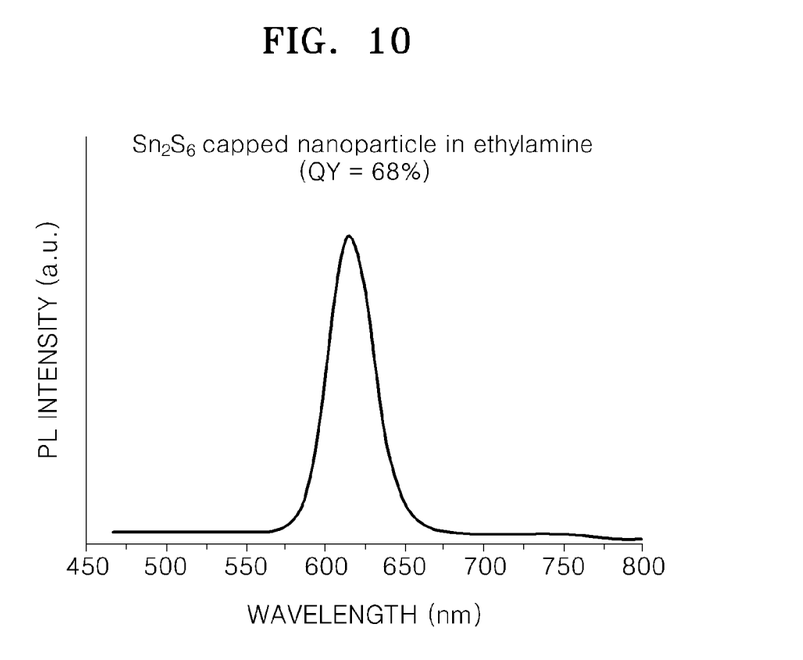
FIG. 10 is a photoluminescence (PL) spectrum of the CdSe/CdS/ZnS nanoparticles of Example 3 after ligands exchange.

FIG. 10 is a photoluminescence (PL) spectrum of the CdSe/CdS/ZnS nanoparticles of Example 3 after ligands substitution. After the ligand substitution, the PL spectrum was measured for the CdSe/CdS/ZnS nanoparticles with the $Sn_2S_6$ hydrazine hydrate ligands dissolved (dispersed) in ethanolamine. Also, referring to FIG. 10, a luminescence quantum yield (QY) of the $Sn_2S_6$ ligand-capped CdSe/CdS/ZnS nanoparticles after ligands substitution was 68%. Inorganic ligands-capped CdSe/ZnS nanoparticles prepared using a hydrazine showed reduction to a level of about 40-50% of photoluminescence intensity, compared to the same nanoparticles, and a luminescence (QY) was 35-41%. (refer to *J. Am. Chem. Soc.*, 2010, 132 (29), pp 10085-10092). The QY of the CdSe/CdS/ZnS nanoparticles capped with the $Sn_2S_6$ hydrazine hydrate ligands of Example 3 was higher than that of the inorganic ligand-capped CdSe/ZnS nanoparticles of the above article. Such an increase in the QY of MCC hydrazine hydrate-capped nanoparticles obtained by the processes described in various embodiments may be attributed to the feature of the processes that the hydrazine hydrate solvent does not directly affect the preparation of nanoparticles capped with MCC hydrazine hydrate which increases a photoluminescence efficiency.

It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:

1. A particle comprising:
   a nanoparticle comprising a semiconductor material in which each dimension is less than 100 nm; and
   inorganic ligands coupled to a surface of the nanoparticle, said inorganic ligands comprising hydrazine hydrate, wherein the inorganic ligands are a metal chalcogenide complex comprising hydrazine hydrate of $Sn_2S_6$, $Sn_2Se_6$, $In_2Se_4$, $In_2Te_3$, $Ga_2Se_3$, $CuInSe_2$, $Cu_7S_4$, $Hg_3Se_4$, $Sb_2Te_3$, or ZnTe.

2. The particle of claim 1, wherein the hydrazine hydrate comprises a monohydrate, dihydrate, trihydrate, tetrahydrate, pentahydrate, hexahydrate, or a combination thereof.

3. The particle of claim 1, wherein the nanoparticle comprises CdS, CdSe, CdTe, ZnS, ZnSe, ZnTe, ZnO, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, CdHgZnTe, CdZnSeS, CdZnSeTe, CdZnSTe, CdHgSeS, CdHgSeTe, CdHgSTe, HgZnSeS, HgZnSeTe, or HgZnSTe; GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InNP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, or InAlPSb; SnS, SnSe, SnTe, PbS, PbSe, PbTe, SnSeS, SnSeTe, SnSTe, PbSeS, PbSeTe, PbSTe, SnPbS, SnPbSe, SnPbTe, SnPbSSe, SnPbSeTe, or SnPbSTe; Si, Ge, SiC, SiGe, or a combination of two or more of them.

4. The particle of claim 1, the nanoparticle has a core-shell structure or a core-shell-shell structure.

5. A solution of a particles comprising:
 the particles of claim 1; and
 a solvent dissolving or dispersing the particles,
 wherein the solvent comprises ethanolamine, dimethyl sulfoxide, dimethylformamide, or formamide.

6. The particle of claim 1, wherein the nanoparticle comprises CdSe/CdS/ZnS, and the inorganic ligands include $Sn_2S_6$ hydrazine monohydrate.

\* \* \* \* \*